United States Patent [19]

Sumi

[11] Patent Number: 4,888,080
[45] Date of Patent: Dec. 19, 1989

[54] PROJECTED PRESS DEVICE FOR RAISING FILM

[75] Inventor: Sigeo Sumi, Saitama, Japan

[73] Assignee: Somar Corporation, Tokyo, Japan

[21] Appl. No.: 11,479

[22] Filed: Feb. 5, 1987

[30] Foreign Application Priority Data

Feb. 5, 1986 [JP] Japan .................................. 61-23178

[51] Int. Cl.$^4$ ........................................... B32B 31/18
[52] U.S. Cl. ..................................... 156/344; 156/584
[58] Field of Search ................... 156/584, 344; 221/71

[56] References Cited

U.S. PATENT DOCUMENTS

| 3,669,445 | 6/1972 | Wallis | 271/26 |
| 3,951,727 | 4/1976 | Greenburg | 156/584 |
| 4,173,510 | 11/1979 | Tobey | 156/584 |
| 4,392,585 | 7/1983 | Reed et al. | 221/71 X |

FOREIGN PATENT DOCUMENTS

| 0142880 | 5/1985 | European Pat. Off. . |
| 1231261 | 12/1966 | Fed. Rep. of Germany . |
| 1232875 | 1/1967 | Fed. Rep. of Germany . |
| 3402009 | 8/1985 | Fed. Rep. of Germany . |
| 0070368 | 6/1979 | Japan .................................. 156/584 |
| 58-91782 | 5/1983 | Japan . |

OTHER PUBLICATIONS

Patent Abstracts of Japan, vol. 9, No. 6, p. 326; 1/11/85 & JP-A-59 154 447 (Hitachi Kasei Kogyo (K.K.) 9/3/84.

*Primary Examiner*—Frank Spear
*Attorney, Agent, or Firm*—Sughrue, Mion, Zinn, Macpeak and Seas

[57] ABSTRACT

A film raising device for raising a film, applied to a film peeling apparatus, comprises a film press member for pressing the film, a supporting member for supporting the film press member slidably and a spring member for urging the film press member in a direction close to the film, the spring member being mounted on the supporting member.

17 Claims, 9 Drawing Sheets

PROJECTED PRESS DEVICE FOR RAISING FILM

BACKGROUND OF THE INVENTION

This invention relates to a film peeling technique, and more particularly to a technique which can be effectively employed to peel a protective film from the substrate or panel.

In a printed circuit board used in an electronic device such as a computer, a predetermined circuit is formed with copper on one or both sides of an insulated substrate or panel.

A printed circuit board of this type can be manufactured as follows: First, a laminate consisting of a photosensitive resin (photo-resist) layer and a translucent resin film (protective film) for protecting the photosensitive resin layer is thermally formed on the conductive layer of the insulated substrate under pressure. Thereafter, a circuit pattern film is laid over the laminate thus formed, and the photosensitive resin layer is exposed to light through the circuit pattern film and the translucent resin film for a predetermined period of time. After the translucent resin film is peeled off, the photosensitive resin layer thus exposed to light is subjected to developing to form an etching mask pattern. Thereafter, the unnecessary parts of the conductive layer are removed by etching, to obtain a printed circuit board having the predetermined circuit pattern.

In the above-described printed circuit board manufacturing method, in developing the photosensitive resin layer it is necessary to peel the translucent resin film off.

An object of the present invention is to obtain a film raising device for reliably raising a film from a panel applied to a film peeling apparatus.

The above-described object and other objects of the invention and novel features of the invention will become more apparent upon reading the following description in conjunction with the accompanying drawings.

SUMMARY OF THE INVENTION

In order to attain the above object as well as other objects, according to the present invention, a projected press device for raising a film, applied to a film peeling apparatus for peeling off and discharging the film from a board, is characterized in that a projected press member is slidably supported to a support member through a spring for pressing the projected press member against the film on the board. Furthermore, according to the present invention, the projected press device for raising a film, applied to a film peeling apparatus, is characterized in that a projected press member is slidably fitted to a holder member through a spring for pressing the projected press member against the film and that the holder member is slidably supported to a support member through a spring for pressing the holder member against the film.

Therefore, in order to peel a film from a board, the support members on both sides of the board is moved close to each other, and the projected press member is pressed to the surface of the board. Then, the support member is rotated, in this state where the projected press member is pressed to the board. As a result, the film is raised. When the support member is rotated, the tip end of the projected press member can be moved horizontally along the board surface with pressing the surface of the board, since the projected press member and the holder member is pressed against the board with the spring.

Moreover, the holder member is larger than in diameter than a hole, with its diameter being 1 to 3 mm bored in the board for positioning purposes. Therefore, the tip end of the projected press member is not caught in the hole on the panel.

DETAILED DESCRIPTION OF THE PREFERRED EMBODIMENTS

Figure 1:
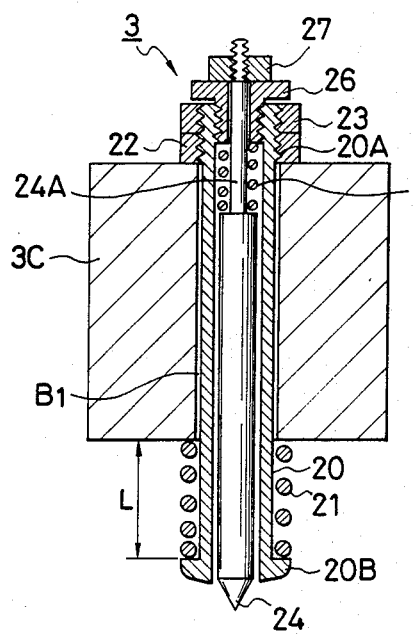
FIG. 1 is a sectional view showing a construction of a projected press device for raising a film, according to a first embodiment of the present invention.

Referring now to the accompanying drawings, a projected press device for raising the film as an embodiment of the present invention will be described in detail.

In the drawings, like reference numerals or characters designate like portions.

FIG. 1 is a sectional view showing the construction of a projected press device for raising a film of a first embodiment of the present invention.

The projected press device in FIG. 1 includes a cylindrical support holder 20 having, at its one end, an annular projected member 20B. The cylindrical support member 20 has, at the other end thereof, a screw 20A. A first spring 21 is inserted along the outer peripheral surface of the support holder 20 of the projected press member. The support holder 20 with the spring 21 thus constructed is inserted into a through-hole B1 provided in a support member (rotary shaft) 3C for supporting the projected press device for raising the film, with the tip end of the annular projected member 20B of the support holder 20 being directed forwardly. Subsequently, a position regulating nut 22 is screwed onto the screw 20A, so that the support holder 20 is slidably mounted on the support member 3C (rotary shaft) for supporting the projected press device. Furthermore, a set screw 23 is screwed onto the screw 20A.

The first spring 21 is employed to press the support holder 20 against a board or panel.

The front end of the support holder 20 is rounded, so that the front end of the support holder 20 has excellent sliding properties. Therefore, the support holder 20 can slide on the board, when the front end thereof contacts the board. As a result, a photosensitive resin layer on the board is prevented from being damaged by the end of the support holder 20. Moreover, other devices such as a fluid injection device may be set close to the support holder 20.

The position regulating nut 22 and the first spring 21 support the support holder 20 slidably on the projected press device support member 3C (rotary shaft). Furthermore, the position regulating nut 22 regulate the distance L between the lower end of the projected press member support shaft 3C and the annular projected member 20B of the support holder 20.

The set screw 23 prevents the position regulating nut 22 from loosening, and makes constant the distance L between the support member (rotary shaft) 3C and the front end of the support holder 20.

The projected press member 24 is slidably inserted in the support holder 20. A second spring 25 is fitted on a thin head 24A of the projected press member 24. The thin head 24A is inserted in the hole of an eyelet screw member 26 which is removably screwed into the support holder 20. A nut member 27 is movably fixed to the top of the head 24A.

The second spring 25 is used to regularly press the projected press member 24 to the board.

The projected press member 24 is adjusted by the nut member 27 such that a tip end of the projected press member 24 projects a little outside of the support holder 20. A tip end angle of the projected press member 24 is selected to be a predetermined angle. It is preferable that the tip end angle be about 60 degrees.

The eyelet screw member 26 is used to adjust the projection length of the projected press member 24 from the lowermost end of the holder 20.

The nut member 27 is used to adjust the projection length of the projected press member 24. Furthermore, the nut member 27 is used to adjust the strength of the second spring 25 for pressing the projected press member 24.

The projection length of the projected press member 24 from the lowermost end of the support holder 20 is selected to about 0.5 mm by the screw member 26 and the nut member 27.

Referring to FIG. 1, the operation of the projected press device for raising the film on a circuit board in the first embodiment is described.

In order to peel the film from the board, at a partial peeling station, the respective support members (rotary shaft) 3C of projected press devices positioned on each side of the board are moved close to each other, so that each of the projected press members 24 of the projected press devices supported by the support members 3C is pressed toward the surface of the board in the vicinity of the leading end of the film. In this state where the projected press member 24 is pressed toward the board, the support member (rotary shaft) 3C is rotated to ensure that the film end portion on the board is raised for subsequent peeling operation at a full peeling station. Since the tip end of the projected press member 24 (and/or the tip end of the support holder 20) are pressed against the board with the first spring 21, when the support member (rotary shaft) 3C is rotated, the tip end of the projected press member 24 and/or the tip end of the support holder 20 can move horizontally along the board surface with pressing against the surface of the board, irrespective of the thickness of the board and the rotation of the support member 3C.

On the board, there is a hole having a diameter of 1 to 3 mm for positioning purposes. The support holder 20 has a diameter larger than the diameter of the hole on the board. Furthermore, the tip end angle of the projected press member 24 is selected to about 60 degrees. The projection length of the projected press member 24 from the lowermost end of the support holder 20 is selected to about 0.5 mm. Therefore, if the projected press member 24 is entered into the hole on the board, the press member 24 can slip out of the hole by the rotation of the support member (rotary shaft) 3C, that is, the movement of the holder 20, as will be described later. Therefore, the projected press member 24 is not caught in the hole on the board. That is, the support holder 20 acts as a stopper for preventing the projected press member 24 from falling in the hole.

Figure 2:
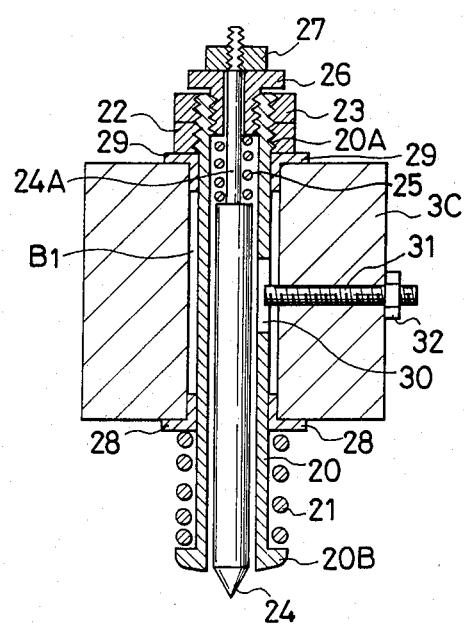
FIG. 2 is a sectional view showing a construction of a projected press device for raising a film, according to a second embodiment of the present invention.

FIG. 2 is a sectional view showing the construction of a projected press device for raising a film of the second embodiment of the present invention.

Figure 3:
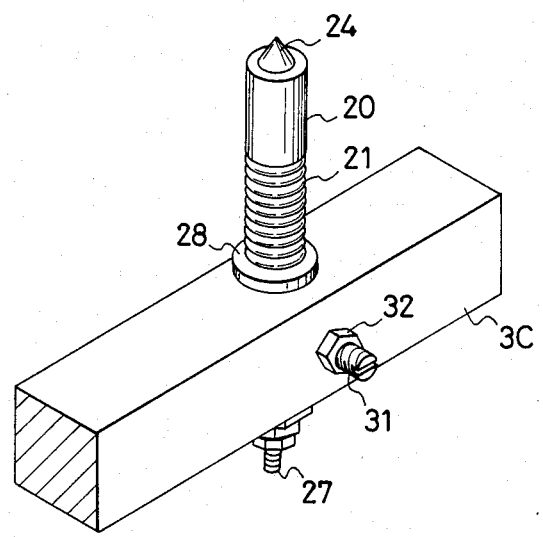
FIG. 3 shows the projected press device of FIG. 2 fitted to the projected press device support member.

FIG. 3 is an external view showing the projected press device of FIG. 2 fitted to the support member.

As shown in FIGS. 2 and 3, since the projected press device according to the second embodiment has eyelet sliding members 28, 29 between the support holder 20 and the support member (rotary shaft) 3C, that is, at the same portion where the projected press device of the first embodiment is mounted on the support member 3C, the support holder 20 can slide in the support member more excellently.

Moreover, a suitable hole 30 is provided in the side portion of the support holder 20. The support member (rotary shaft) 3C is provided with a member 31 to be fitted in the hole 30. The support holder 20 is prevented from rotating with respect to the support member 3C, by the member 31 fitted in the hole 30. The member 31 also prevents the projected press device from falling down when the position regulating nut member 22 is removed from the support holder 20.

The diameter of the hole 30 is selected so that the support holder 20 can slide up and down in its axial direction in the through-hole B1 even when the member 31 is fitted into the hole 30. Furthermore, the diameter of the hole 30 is selected so that the support holder cannot rotate relative to the support member 3C when the member 31 is fitted into the hole 30.

A lock nut 32 is fixed to the member 31 to prevent the member 31 from loosening from the hole 30 of the support holder 20.

Figure 4:
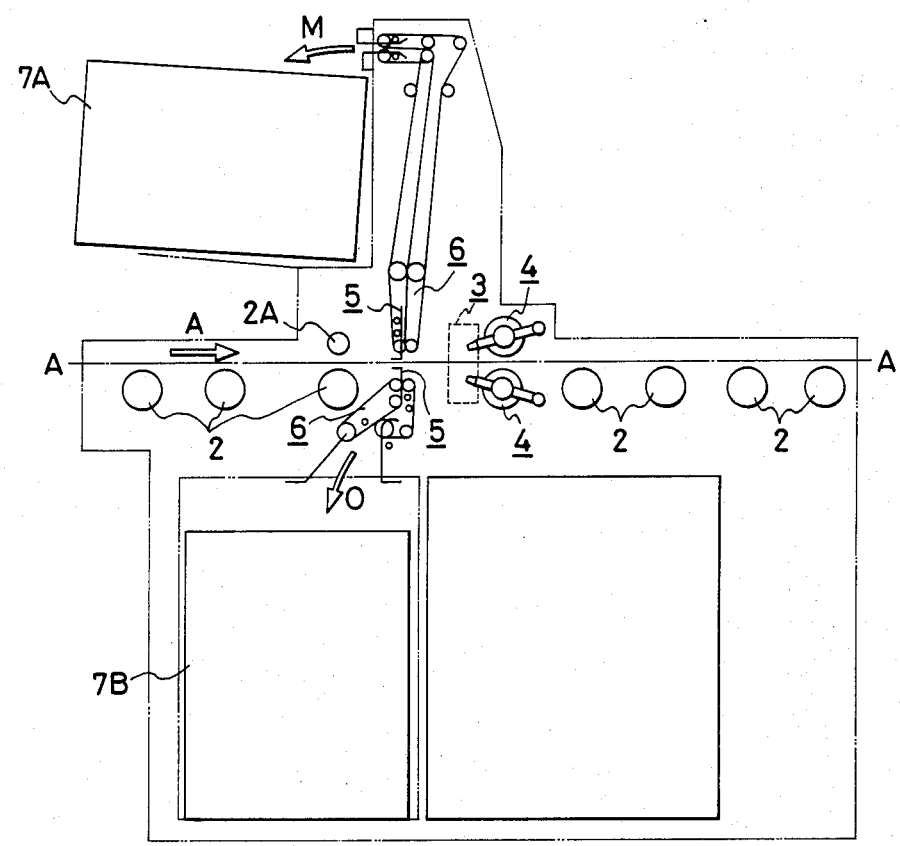
FIG. 4 is a side view showing a schematic construction of an apparatus for peeling a protective film on a board, to which a projected press device for raising a film of the present invention is applied.

FIG. 4 is a schematic side view showing a construction of an apparatus for peeling a protective film on a board, to which a projected press device of the present invention is applied.

Figure 5:
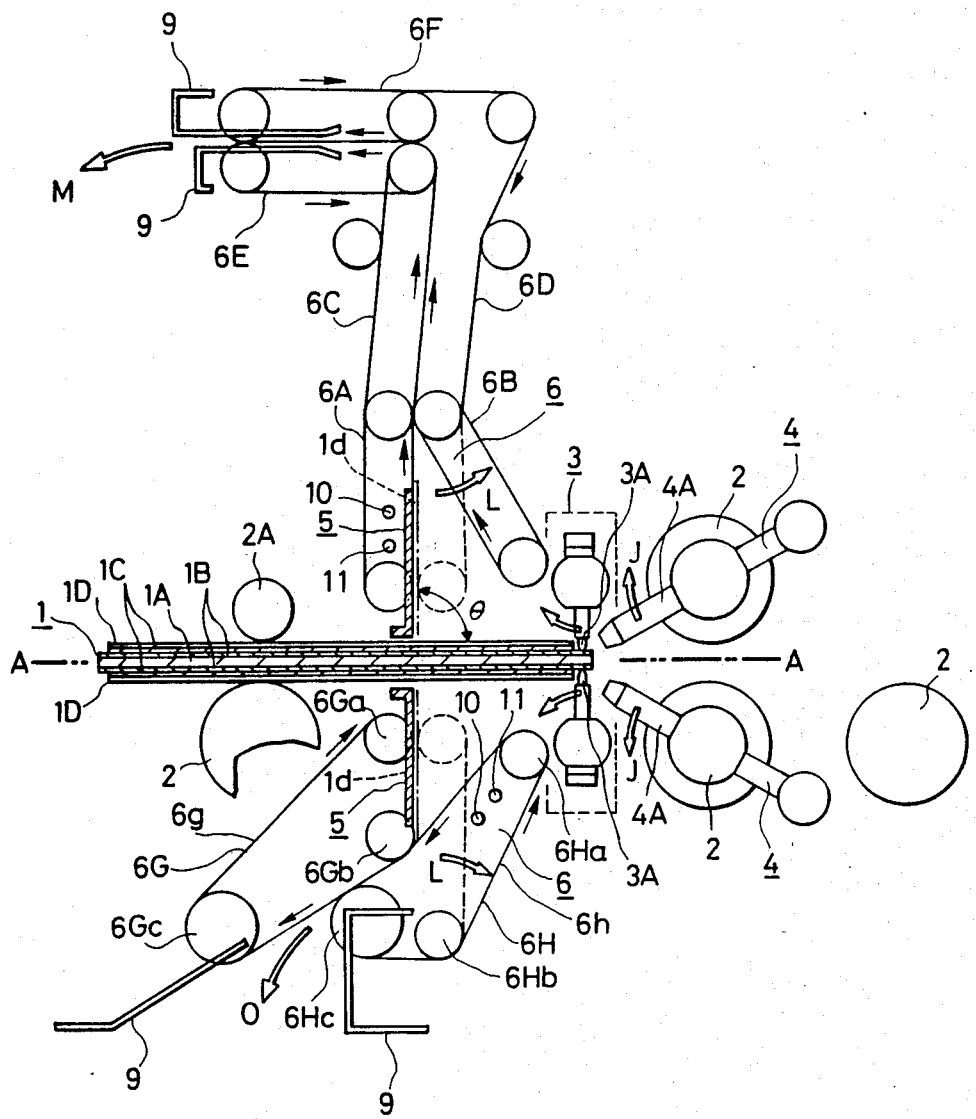
FIG. 5 is an enlarged side view of the principal portion of FIG. 4.

FIG. 5 is an enlarged side view of the principal portion of FIG. 4.

According to the present invention, the mechanism for conveying a board in the film peeling apparatus mainly comprises conveyance driving rollers 2 for conveying a board 1, as shown in FIGS. 4 and 5.

In the above-described conveyance mechanism, a projected press mechanism 3, a fluid injection mechanism 4, a peel angle setting plate (auxiliary peeling plate) 5 and a film delivery mechanism (film conveyance apparatus) 6 are arranged along the conveyance path A—A.

In the board 1, a conductive layer 1B of copper or the like is formed on one or both sides of an insulated substrate 1A, as shown in FIG. 5. A laminate consisting of a photosensitive resin layer 1C and a translucent resin film (or a protective film) 1D is thermally formed on the conductive layer 1B of the board 1 under pressure. The photosensitive resin layer 1C has been exposed to light in a predetermined circuit pattern.

The conveying rollers 2 are so designed as to convey the board 1 in the direction of the arrow A, as shown in FIG. 4.

Figure 6:
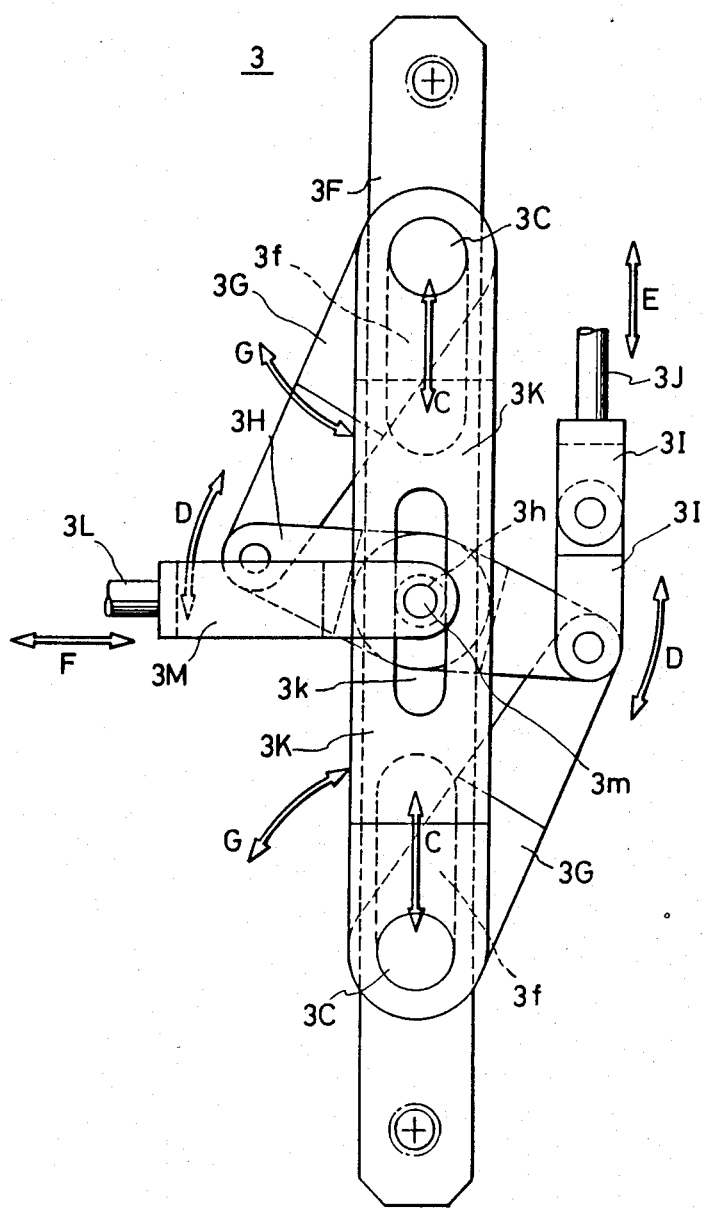
FIG. 6 is a view showing the projected press mechanism of FIGS. 4 and 5.
Figure 7:
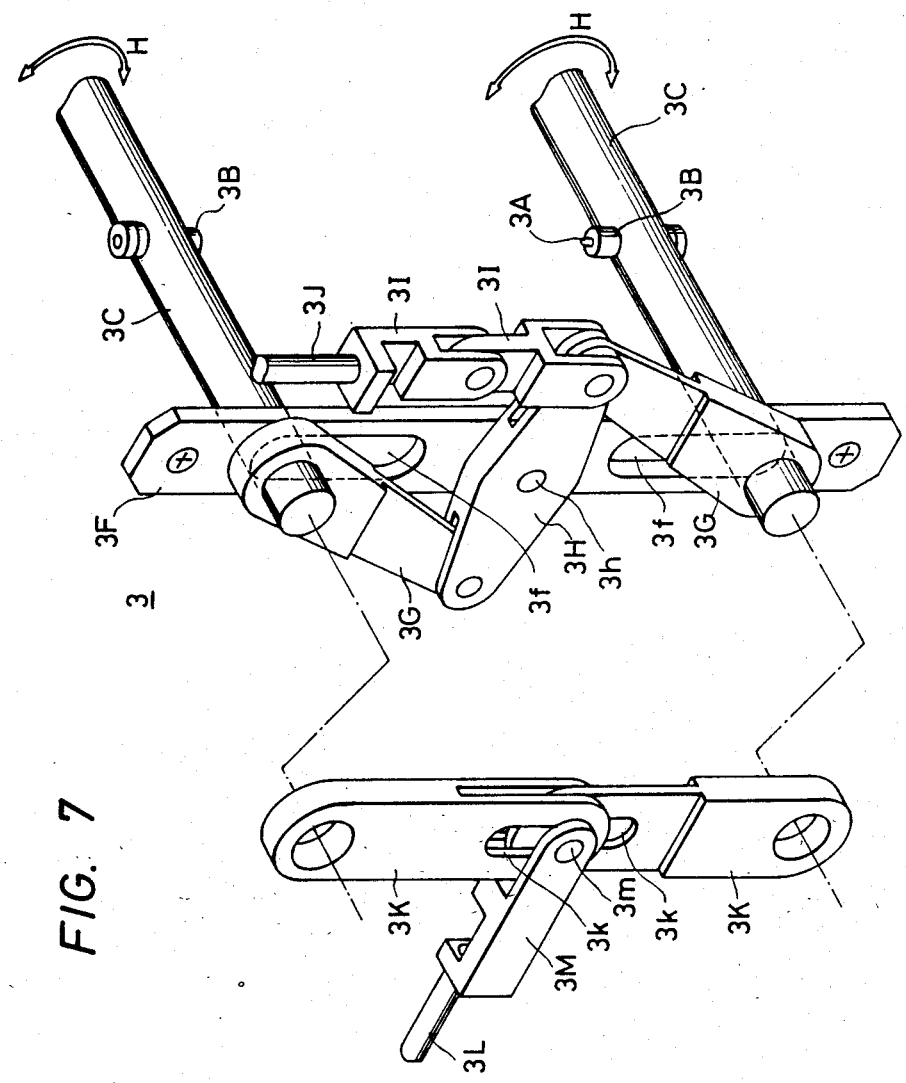
FIG. 7 is an enlarged exploded view of FIG. 6.

The projected press mechanism 3 is constructed as shown in FIGS. 6 to 7.

The projected press mechanism 3 comprises a plurality of projected press devices 3A installed on both sides of the board 1. The projected press members 3A are arranged in the direction across the conveyance direction (the crosswise or transverse direction of the printed circuit board 1).

One end (or both ends) of the projected press device supporting member (rotary shaft) 3C is, as shown in FIGS. 6, 7 rotatably coupled to one end of a moving arm member 3G through a guide slit 3f made in a guide member 3F. The guide member 3F is fixed to the apparatus body with machine screws and the like (not shown). The guide slit 3f is formed in the direction (of an arrow C) approaching to or departing from the board 1 so as to guide the projected press member supporting rotary shaft 3C, i.e., the projected press member 3A in the direction of an arrow C.

The other end of each moving arm member 3G is rotatably secured to one of the opposite ends of a rotary arm member 3H secured rotatably on the rotary shaft 3h in the direction of an arrow D. The rotary arm member 3H is capable of moving each moving arm member 3G in the longitudinal direction of an arrow C.

The guide member 3F, the moving arm member 3G and the rotary arm member 3H for guiding the projected press member supporting rotary shaft 3C constitute the link mechanism of the projected press mechanism 3 for causing the projected press members 3A installed on both sides of the printed circuit board 1 to move close to and away from each other, by the movement of the shaft 3J of the driving source for both side use in the direction of an arrow E. The shaft 3J is coupled to one end of the rotary arm member 3H through an arm coupling member 3I. The members constituting the link mechanism each are prepared from material relatively hardly deformable against external force, such as iron, aluminum alloy and rigid plastics. As a driving source a pneumatic or hydraulic cylinder, or a solenoid can be used. The shaft 3J is not limited to be coupled to one end of the rotary arm member 3H. The shaft 3J may be coupled to one end of the moving arm member 3G through the arm coupling member 3I.

By thus coupling the projected press device 3A to the driving source by means of the link mechanism, the projected press members 3A installed on both sides of the the board 1 each may be caused to contact with or depart from the surface of the board 1. The projected press member 3A moves in the direction of the arrow C. In other words, the link mechanism is capable of driving the projected press members 3A on both sides by one driving source for both side use. Therefore, it is unnecessary to provide individual driving sources for driving the projected press members 3A on each side of the board 1.

Material forming the guide member 3F, the moving arm members 3G and the rotary arm member 3H constituting the link mechanism are rigid. The operating range of them is defined by the guide slit 3f and the rotary shaft 3h. Therefore, the projected press members 3A on both sides of the board 1 can be controlled accurately, with the operating amount and operating time of the projected press members 3A on both sides being almost equal to each other.

The link mechanism for coupling the projected press member 3A and the driving source for both side use can be made simpler in construction than what is formed with a rack and pinion or gear mechanism, since the number of parts required is smaller and each part is simpler in configuration.

A projected press member rotating arm member 3K is installed at the end (or both ends) of each projected press member supporting rotary shaft 3C linked with the moving arm member 3G in such a manner that one end of the projected press member rotating arm member 3K is fixed to the end of the projected press member supporting rotary shaft 3C. At the other end of each projected press member rotating arm member 3K, provided is a slit 3k. The shaft 3m of the arm coupling member 3M connected to the shaft 3L of the driving source for both side use is passed through the slit 3k. In other words, the projected press member rotating arm member 3K is coupled to the shaft 3L of the driving source for both side use through the coupling arm member 3M. As the driving source for both side use, a driving source similar to what is applied to the above-described link mechanism may be used.

When the shaft 3L moves in the direction of an arrow F, the projected press member rotating arm member 3K rotates in the direction of the arrow G and the projected press member supporting rotary shaft 3C rotates in the direction of an arrow H, so that the projected press member 3A presses the end of the laminated body. In other words, the projected press member rotating arm member 3K and the arm coupling member 3M constitute the projected press member pressing mechanism of the projected press mechanism 3.

The projected press member pressing mechanism thus constructed is capable of operating the projected press members 3A on both sides of the printed circuit board 1 with one driving source and is capable of controlling the operating quantity and time thereof accurately, as in the case of the link mechanism for nearing and parting the projected press members 3A.

Moreover, the projected press member pressing mechanism can simplify the coupling mechanism for coupling the projected press member 3A and the driving source for both side use.

The projected press mechanism 3 thus comprises the projected press members 3A, the link mechanism for causing the projected press member 3A to near and depart from the board 1, and the projected press member pressing mechanism for pressing the end of the laminated body with the projected press member 3A.

Although the link mechanism or projected press member pressing mechanism and the driving source for both side use are installed on one side of the projected press member supporting rotary shaft 3C, they may be installed on both sides according to the present invention.

Referring to FIGS. 4 through 9, the operation of the projected press mechanism 3 will be described briefly.

A thin film end detector (not shown) is used first. As a thin film end detector, touch sensor for electrically detecting the end of a thin film laid on the board 1 or a photosensor for detecting the same optically can be used.

When the end of a thin film stuck onto the board is detected by the thin film end detector, a pinch roller 2A shown in FIGS. 4 and 5 is pressed against the board 1 using a press means (not shown), and the conveyance of the board 1 is temporarily stopped by the pinch roller 2A and a conveyance driving roller 2. At this time, the board is prevented from moving, since material such as rubber having a high coefficient of friction is attached to the outer peripheral surface of the conveyance driving roller 2 opposite to the pinch roller 2A. Therefore, the conveyance of the board 1 is stopped securely, so that the board 1 is fixed.

Figure 8:
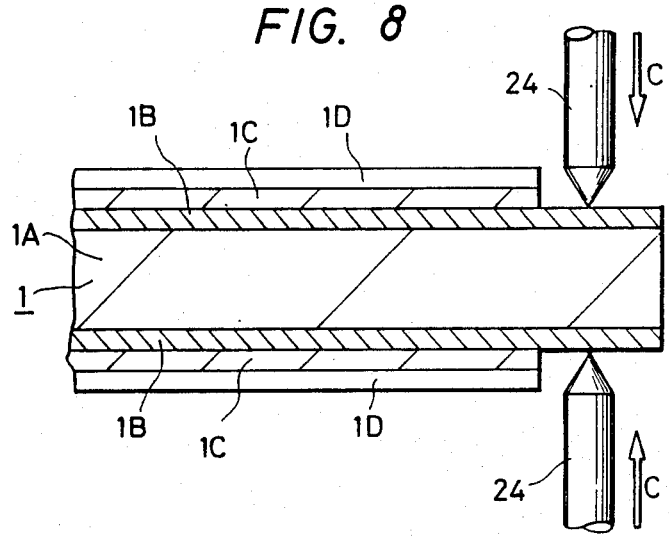
FIGS. 8 and 9 are sectional views of the principal portions of the board of FIG. 5.

The shaft 3J of the driving source for both side use coupled to the link mechanism is moved in the direction of an Arrow E (upward in the FIG. 6). This operation allows the link mechanism constituted by the rotary arm member 3H, the moving arm member 3G and the guide member 3F to operate, so that the projected press member supporting rotary shaft 3C is caused to move in the direction of the arrow C. As a result of which, each of the front ends of the projected press members 3A on both sides of the printed circuit board 1 contacts with the surface of the conductive layer 1B at the end of the laminated body as shown in FIG. 8. The tip end of the projected press member 24 is contacted with the surface of the conductive layer 1B with a suitable pressing force such that the spring 25 (21) may have energy.

Figure 9:
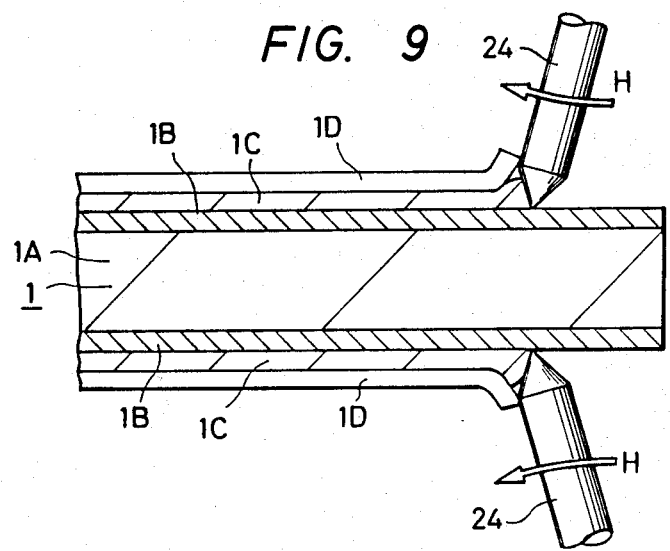

While the projected press member 3A is in contact with the conductive layer 1B, the shaft 3L of the driving source for both side use coupled to the projected press member pressing mechanism is moved in the direction indicated by an arrow F (to the left in the FIG. 6). This movement of the shaft 3L causes the projected press member pressing mechanism comprising the projected press member rotating arm member 3K and the arm coupling member 3M to operate, so that the projected press member supporting rotary shaft 3C is rotated in the direction of the arrow H. By the rotation of the projected press member supporting rotary shaft 3C, the front ends of the projected press members 3A on both sides of the board 1 press the end of the laminated body, as shown in FIG. 9.

The end of the laminated body having the photosensitive resin layer 1C and the translucent resin film 1D is pressed by the projected press members 3A of the projected press mechanism 3, so that a part of the translucent resin film 1D is peeled off from the photosensitive resin layer 1C, and a gap is produced at the interface between the film 1D and the layer 1C, as will be described hereinafter. The photosensitive resin layer 1C is prepared from material softer than that for the translucent resin film 1D. Therefore, the film 1C is apt to be subjected to plastic deformation by the pressure applied by the projected press member 3A than the layer 1D. Therefore, first, only the film 1C is deformed. The adhesion of the layer 1D to the film 1C reduces, before the layer 1D is deformed. Therefore, a gap is produced between the film 1C and the layer 1D.

Moreover, the end of the translucent resin film 1D can be peeled off by the needle-shaped projected press member 3A which is simple in configuration.

Since the projected press member 3A is installed in the conveyance path of the board, the end of the translucent resin film 1D can automatically be peeled off.

A plurality of projected press members 3A are provided in the direction crossing (crosswise direction) the conveyance direction of the printed circuit board 1 according to this embodiment, in order that the film of the laminated body which is heat bonded distortedly on the printed circuit board 1 can also be peeled off surely. However, the present invention is not limited to the above structure. In other words, the projected press mechanism 3 may be so arranged as to have only one projected press member 3A on the respective sides of the board 1, if the end portion of the photosensitive resin layer 1C and the translucent resin film 1D is pressed so that the film 1D can be surely peeled off.

Although the projected press members 3A are arranged in the direction (crosswise direction) crossing the conveyance direction of the board 1 according to this embodiment, the projected press members 3A may be arranged at the end portions or portions close to the corner of the laminated body, in the same direction as the conveyance direction of the board 1. In this case, the nozzle 4A of the fluid injection mechanism 4 is set close to the projected press member 3A.

The projected press member pressing mechanism of the projected press mechanism 3 according to this embodiment of the present invention is arranged in the form of the link mechanism. However, the projected press member pressing mechanism according to the present invention may be so constructed that the board 1 is carried slightly by the rotation of the conveyance driving roller 2 (or the pinch roller 2A) with the projected press member 3A being in contact with the surface of the board 1 at the end of the laminated body, and the end of the laminated body is pressed by the projected press member 3A. That is, the projected press member pressing mechanism may be constructed by a conveyance mechanism.

Moreover, the cross section of the projected press member supporting rotary shaft 3C in the direction across the axis of the shaft according to the present invention may be square, in order to increase the accuracy of processing the through-hole into which the device 3A is fitted and in order to facilitate the processing.

As shown in FIGS. 4 and 5, the fluid injection mechanism 4 may be so arranged as to send a jet of pressurized fluid such as air or inactive gas or liquid such as water out of the nozzle 4A directly to the gap between the photosensitive resin layer 1C and the peeled translucent resin film 1D. The fluid injection mechanism is also positioned close to the projected press mechanism 3 so that the fluid can instantly be sent to the gap. The fluid injection mechanism 4 is provided with the nozzle 4A with its set angle being variable in the direction of an arrow J. As a result, the fluid injection mechanism 4 sets its nozzle 4A close to the gap between the layers 1C and 1D at the time of injecting the fluid, and after the fluid has been injected, the fluid injection mechanism 4 moves the nozzle 4A back to the position where the nozzle is prevented from touching the board 1.

By the fluid injection mechanism 4, fluid is blown into the gap between the photosensitive resin layer 1C and the translucent resin film 1D produced under the pressure of the projected press member 3A, as a result of which it is ensured to peel the translucent resin film 1D off the photosensitive resin layer 1C instantly.

Figure 10:
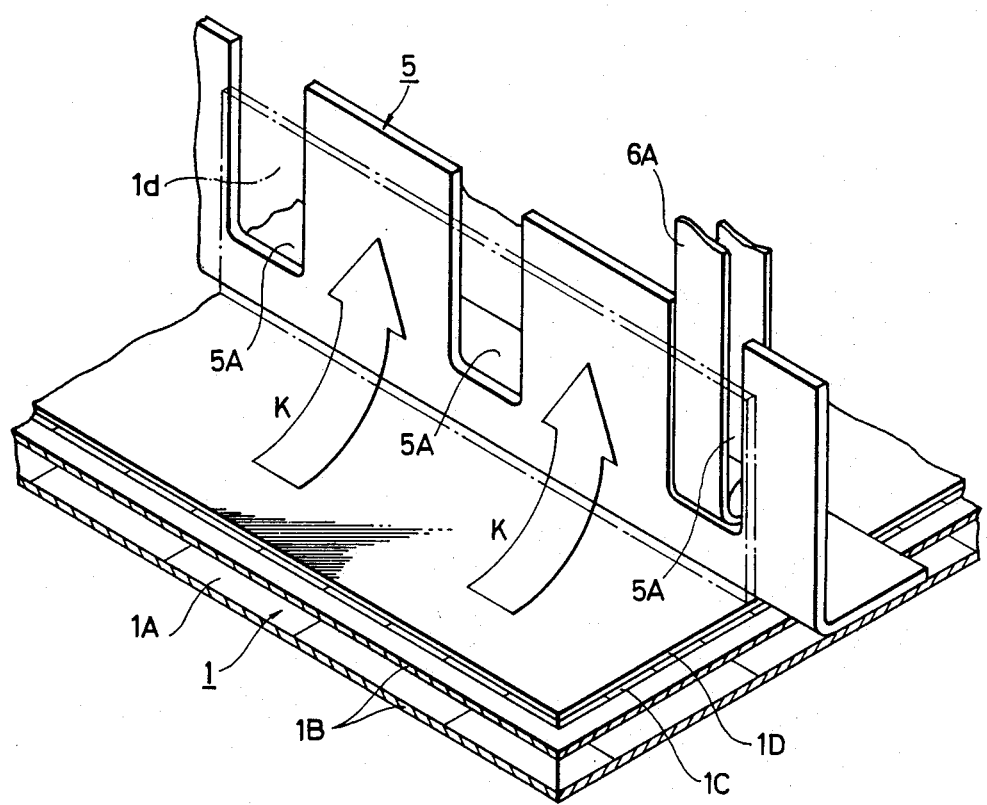
FIG. 10 is a perspective view of the principal portions of the peel angle setting plate of FIGS. 4 and 5.

As shown in FIGS. 5 and 10, the front end 1d of the translucent resin film in the conveyance direction thereof peeled off by the fluid injection mechanism 4 is stuck to the peel angle setting plate (auxiliary peeling plate) 5 by the fluid pressure, and the peel angle $\theta$ for the peel position and direction is set. The translucent resin film 1d is shown by one-dot-and-dash line of FIGS. 5 and 10. The peel angle $\theta$ is the angle of the translucent resin film 1d pulled up with respect to the translucent resin film 1D stuck onto the board 1 (or the board 1). The peel angle $\theta$ is set to about 90 degrees.

The peel angle setting plate 5 is installed such that the front end of the peel angle setting plate 5 (peel position) on the peeling side is apart from the translucent resin film 1D stuck to the printed circuit board 1 and such that the setting plate may not brush with the resin film 1D to prevent the photosensitive resin layer 1C from being damaged or broken down. Furthermore, the peel angle setting plate 5 is movably arranged so that the end of the peel angle setting plate 5 sticks tightly to the translucent resin film 1D during the time the fluid is being sprayed, for preventing reduction of the peel effect, since the reduction of the peel effect is caused if the fluid is blown through between the end of the peel angle setting plate 5 and the board. Moreover, the front end of the peel angle setting plate 5 is in a circular arc form with its curvature radius being small, that is, its curvature radius being less than 3 mm.

Moreover, the peel angle setting plate 5 has its front end located closer to the printed circuit board 1 than the thin film delivery mechanism 6. The peel angle setting plate 5 extends in the peel direction (film delivery direction) with a predetermined length. The peel angle setting plate 5 extends in a crosswise direction of the peeled film crossing the film peeling direction with its length being enough to cover the width of the conveyance path of the printed circuit board 1 or the fluid injection width in the peel direction. In other words, the peel angle setting plate 5, as the direction of the fluid flown is shown by an arrow K in FIG. 10, is capable of increasing the peeling effects, by preventing the fluid from being blown to the rear side of the peel angle setting plate 5 and is capable of increasing the adhesion of the peeled translucent resin film 1d to the peel angle setting plate 5.

The peel angle setting plate 5 is fixed to the apparatus body at a predetermined position apart from the nozzle 4A in the fluid flowing direction.

The peel angle setting plate 5 is able to stabilize the peel position and add uniform peeling force to the translucent resin film 1D. Accordingly, the peel angle setting plate 5 prevents the peel position from shifting when the translucent resin film 1D is being peeled off and prevents peel stress from distorting and the photosensitive resin layer 1C from being damaged or broken.

The peel angle $\theta$ of the peel angle setting plate 5 with respect to the translucent resin film 1D may be set variable within the range of obtuse to right angle, according to changes in conditions, such as change of material for the translucent resin film 1D, change of the fluid pressure in the fluid spray mechanism 4, etc. Moreover, the peel angle setting plate 5 may be so arranged as to be movable, in corresponding to the thickness of the printed circuit board 1, the photosensitive resin layers 1C or the translucent resin films 1C. The peel angle setting plate 5 may be moved or transferred by an air or hydraulic cylinder.

Figure 11:
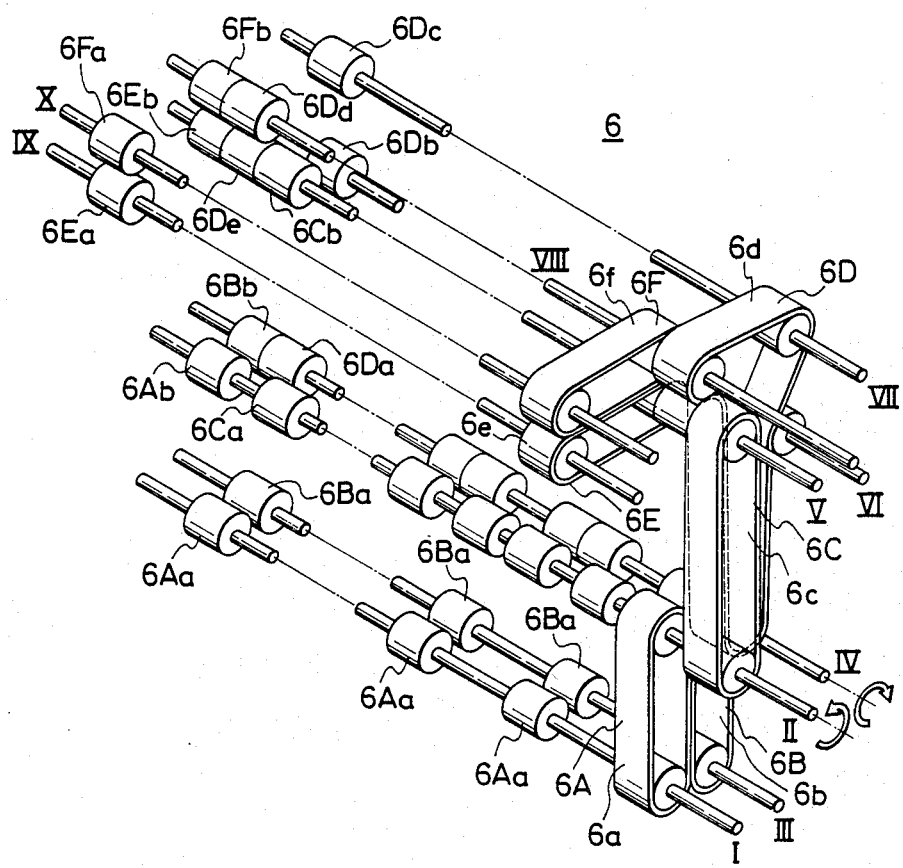
FIG. 11 is an expanded exploded perspective view of the film conveyance mechanism of FIGS. 4 and 5.

The translucent resin film 1d stuck to the peel angle setting plate 5 by the fluid injection mechanism 4 is, as shown in FIGS. 4, 5 and 11, carried out by the film carrying out mechanism (thin film conveyance mechanism) 6 while the thin film is being peeled off.

The thin film conveyance mechanism 6 comprises an upper conveyor belt mechanism and a lower conveyor belt mechanism installed on both sides of the board 1, respectively.

The upper conveyor belt mechanism consists of, as shown in FIG. 11 in detail, fixed conveyor belts 6A, 6C, 6D, 6E, 6F and moving conveyor belts 6B.

The fixed conveyor belt 6A consists of a roller 6Aa supported by a driven shaft I, a roller 6Ab supported by a driving shaft II and a belt 6a wound on the rollers 6Aa, 6Ab.

The moving conveyor belt 6B consists of a rollers 6Ba supported by a driven shaft III, a roller 6Bb supported by a driving shaft IV and a belt 6b wound on the rollers 6Ba, 6Bb. The moving conveyor belt 6B is rotated on the driving shaft IV in the direction of an arrow L as shown in FIG. 5. The moving conveyor belt 6B facilitates the adhesion of the peeled translucent resin film 1d to the peel angle setting plate 5 and is capable of carrying the translucent resin film 1d by sandwiching it between the moving conveyor belt 6B and the fixed conveyor belt 6A. The operation of sandwiching the translucent resin film 1d between the fixed and moving conveyor belts 6A, 6B is conducted through a cut 5A provided in the peel angle setting plate 5, as shown in FIG. 10. The cut 5A is designed to help the conveyor belts 6A, 6B sandwich the translucent resin film 1d whose peel position and angle have been set by the peel angle setting plate 5 when both the belts 6A, 6B reach the translucent resin film 1d. As a result, it is assured that the translucent resin film 1d is sandwiched between the fixed and moving conveyor belts 6A, 6B.

The fixed conveyor belt 6C consists of a roller 6Ca supported by the driving shaft II, a roller 6Cb supported by a driven shaft V and a belt 6c wound on rollers 6Ca, 6Cb.

The fixed conveyor belt 6D consists of a roller 6Da supported by the driven shaft IV, a roller 6Db supported by the driven shaft VI, a roller 6Dc supported by a driven shaft VII, a roller 6Dd supported by a driven shaft VIII, a roller 6De supported by the driven shaft V and a belt 6d wound on rollers 6Da to 6De.

Figure 12:
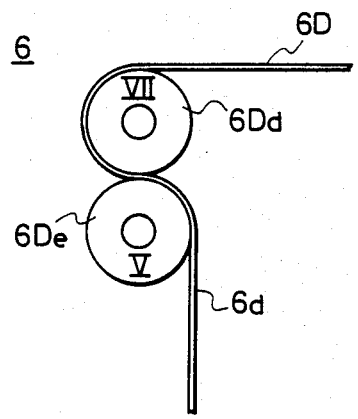
FIGS. 12 is a sectional view of the principal portions of the film conveyance mechanism of FIG. 11.

The fixed conveyor belts 6C and 6D are so arranged as to further carry out the translucent resin film 1d carried out by the fixed and moving conveyor belts 6A and 6B. The roller 6De of the fixed conveyor belt 6D is intended to comply with the change of the conveyance direction at a large angle when the translucent resin film 1d is carried out from the fixed conveyor belts 6C, 6D to the fixed conveyor belts 6E, 6F, as shown in FIG. 12. In other words, the curvature radii of the belts 6c and 6d, on their surfaces contacting with the translucent resin film 1d at the position where the conveyance direction is changed, are made equal to each other by the roller 6De. Accordingly, the translucent resin film 1d is prevented from producing wrinkles and trouble such as a jam during conveyance.

The fixed conveyor belt 6E consists of a roller 6Ea supported by a driven shaft IX, a roller 6Eb supported by the driven shaft V and a belt 6e wound on the rollers 6Ea, 6Eb.

The fixed conveyor belt 6F consists of a roller 6Fa supported by a driven shaft X, a roller 6Fb supported by the driven shaft VIII and a belt 6f wound by the rollers 6Fa, 6Fb.

As shown in FIGS. 4, 5, the fixed conveyor belts 6E and 6F are so arranged as to discharge the translucent resin film 1d carried by the fixed conveyor belts 6C and 6D from the apparatus body in the direction of an arrow M. The translucent resin film 1d discharged from the apparatus body is contained in the container 7A for containing the peeled upper translucent resin films discharged, as shown in FIG. 4. The container 7A for containing the peeled upper translucent resin films discharged is detachably mounted on the apparatus body, in its upper portion.

The lower conveyor belt mechanism comprises a fixed conveyor belt 6G and a moving conveyor belt 6H as shown in FIG. 5.

The fixed conveyor belt 6G consists of rollers 6Ga, 6Gc supported by different driven shafts (not shown), a roller 6Gb supported by a driven shaft (not shown) and a belt 6g wound on the rollers 6Ga to 6Gc.

The moving conveyor belt 6H consists of rollers 6Ha and 6Hc supported by different driven shafts (not shown), a roller 6Hb supported by a driven shaft (not shown) and a belt 6h wound on the rollers 6Ha to 6Hc.

The fixed conveyor belts 6G and the moving conveyor belt 6H carry a translucent resin film 1d peeled from the another side of the board, with peeling the film 1d whose peel position and angle are set by the peel angle setting plate 5 as in the case of the above-described upper conveyor belt mechanism. The conveyor belts 6G and 6H discharge the translucent resin film 1d from the apparatus body in the direction of an arrow O. The translucent resin film 1d discharged from the apparatus body is contained in a container 7B for containing the discharged lower translucent resin films as shown in FIG. 4. The container 7B for containing the discharged lower translucent resin films is detachably mounted on the apparatus body. Moreover, the container 7A for containing the discharged upper translucent resin films is installed above the container 7B so that area occupied by the containers 7A and 7B is reduced to thereby make the apparatus body compact.

Moreover, a roll-in preventing member 9 is installed close to the conveyance path on the discharge side, between the respective two conveyor belts 6E and 6E (6F and 6F, 6G and 6G and 6H and 6H) disposed adjacent to each other in the crosswise direction of the film 1d conveyed crossing the conveyance direction. Accordingly, the translucent resin film 1d is prevented from being wound on the fixed conveyor belts 6E, 6F, 6G or moving conveyor belt 6H.

As shown in FIG. 5, static eliminators 10 and ion dispersion devices 11 are installed close to the fixed conveyor belt 6A and the moving conveyor belt 6H, respectively. The static eliminator 10 is used to discharge ions in order that the static electrification of the translucent resin film 1d to be occurred while the film 1d is peeled off or carried can be reduced. The ion dispersion device 11 disperses the ions discharged by the static eliminator 10, in order to efficiently reduce the static electrification of the film 1d. The device 11 disperses ions using pressurized fluid such as air, for example.

The projected press member supporting member (rotary shaft) is so constructed as to be rotatable, in the above-described embodiment. However, the supporting member may be so constructed as to be fixed.

The projected press device for raising a film may be constructed, as shown in FIG. 13 through 17, according to a third embodiment of the present invention. According to the third embodiment, the projected press member 24 has two finger portions 41 and 41 for raising the leading end of the film on the board. The projected press member 24 is slidably supported to a holding member 42 through a bearing 50 by a spring 43. The holding member 42 is fixedly secured to the support member (rotary shaft) 3C by two screw members 46. Two nut members 22 and 23 are threadedly provided on the projected press member 24 at its upper portion, as in the case of the first and second embodiments.

The projected press member 24 has a hole 44 for receiving a key screw 45 provided in the holding member 42. The projected press member 24 is prevented from rotating, since the key screw 45 is engaged in the key slot 44. A size of the key slot 44 is selected such that the press member 24 can slide in its axial direction but cannot rotate relative to the holding member 42.

Figure 13:
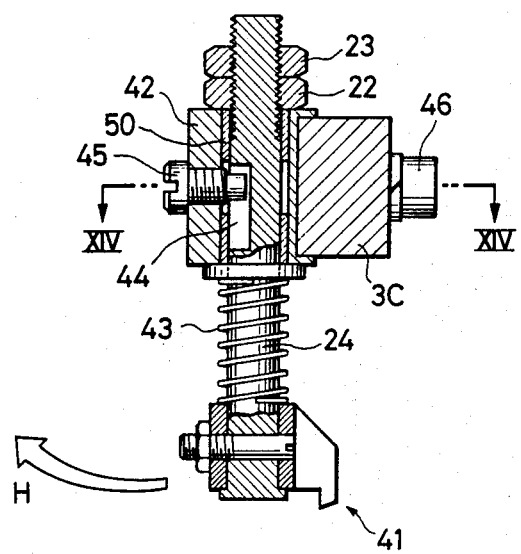
FIG. 13 is a sectional view showing a construction of a projected press device for raising a film, according to a third embodiment of the present invention.
Figure 14:
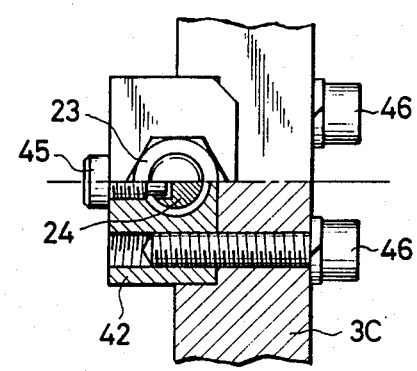
FIG. 14 is a partial cross sectional view of the projected press device of FIG. 13, along the line XIV—XIV.
Figure 15:
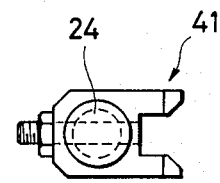
FIG. 15 is plan view showing a construction of the finger portions of the projected press device of FIG. 13.
Figure 16:
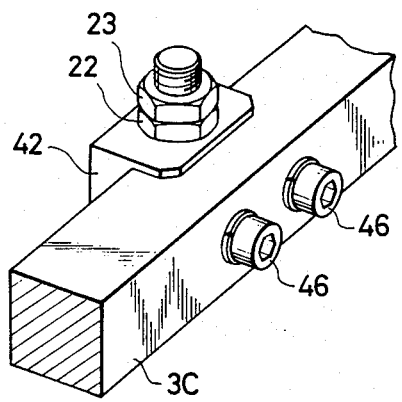
FIG. 16 is a perspective view showing the holding member of FIG. 13 fixed to the support member.
Figure 17:
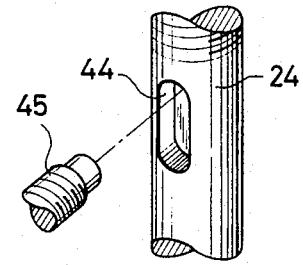
FIG. 17 is a perspective view showing a key slot of the press member of FIG. 13.

When the support member (rotary shaft) 3C is rotated in a direction of an arrow H shown in FIG. 13, the projected press member 24 is angularly moved in the direction of the arrow H, so that the finger portions 41 may press and raise the end portion of the film on the board.

As described above, according to the third embodiment of the present invention, since the projected press member 24 has two finger portions 41 for raising the end portion of the film, the film can be raised without fail. Even if one of the finger portions 41 would enter into a positioning hole formed on the board, the other finger portion can raise the film end, to thereby peel the end portion of the film from the board.

As set forth above, the present invention has the following effects:

(A) The projected press member for raising a film laminated on a panel is slidably supported to the support member through a spring for pressing the projected press member against the printed circuit board. The tip end of the projected press member is pressed against the board by the force of the spring. Therefore, when the support member is rotated, the tip end of the porjected press member can be moved horizontally along the surface of the board with the tip end being pressed against the board surface, irrespective of the thickness and shape of the board.

(B) The projected press member for raising a film is slidably supported to the support holder through a spring for pressing the projected press member against the printed circuit board. The support holder is slidably supported to the support member through a spring for pressing the support holder thereof against the board. Furthermore, since the support holder is made larger in diameter than the hole having a diameter of 1 to 3 mm provided on the printed circuit board for positioning purposes, the tip end of the projected press member is prevented from being caught in the hole.

(C) For the above-described advantages (A) and (B) obtained by the present invention, the leading end of the film stuck on either side of the board is surely raised up, in the case where the thickness or shape of the board and film is changed or in the case where the end position of the board stopped on the conveyance path is deviated.

Although the invention is described in its preferred from with a certain degree of particularity, it is believed obvious that various changes and modifications may be made in the invention without departing from the spirit and scope thereof.

What is claimed is:

1. A film raising device for raising an end portion located at one end of a film laminated on part of a main surface of a panel, for use in a film peeling apparatus, said film raising device comprising:

film press means for pressing against an unlaminated part of the main surface of the panel adjacent the one end of the film when said film press means is in a first position and for pressing against the one end of the film when said film press means is in a second position, said film press means comprising an elongate member extending in a first direction, and having a tip portion at one end for contacting the film when said film press means is in said second position;

holding means for holding said film press means for slidable movement in a second direction toward the panel, said holding means including a hollow cylindrical member, said film press means being disposed in said cylindrical member along an axis thereof, wherein said second direction is substantially the same as said first direction;

first spring means for urging said film press means in said second direction, said first spring means being mounted in said cylindrical member at an end of said elongate member opposite to the one end of said elongate member;

supporting means for supporting said cylindrical member for slidable movement in said second direction, said cylindrical member being rotatable with said supporting means; and second spring means for urging said holding means in said second direction relative to said supporting means, said second spring means being mounted on said supporting means;

first transporting means for moving said supporting means to one position at which said film press means is in said first position; and second transporting means for rotating said supporting means to another position at which said film press means is in said second position, wherein said first spring means is adapted to keep said tip portion of said film press means biased into contact with said unlaminated part of said main surface of said panel during rotation of said supporting means with said film press means in said first position to said position at which said film press means is in said second position.

2. A film raising device according to claim 1, wherein, at the one end of the film, there is an edge portion of the film extending in a third direction, and said second transporting means rotates said supporting means about an axis perpendicular to said first direction and parallel to said third direction.

3. A film raising device according to claim 1, wherein said film press means has at least two finger portions for contacting the one end of the film and raising the end portion of the film.

4. A film raising device according to claim 3, further comprising means for preventing rotation of said elongate member about an axis parallel to said first direction.

5. A film raising device according to claim 4, wherein said rotation preventing means comprises a screw member fitted to said supporting means and a hole portion formed in said elongate member for receiving said screw member.

6. A film raising device according to claim 1, wherein said first transporting means and said second transporting means comprise a link mechanism for connecting said supporting means to a power source.

7. A film raising device according to claim 1, wherein said cylindrical member has a predetermined radius and an end portion proximate to said tip portion of said elongate member, which end portion has a radius greater than said predetermined radius, said second spring means mounted on said supporting means being disposed around said cylindrical member and in contact with said end portion.

8. A film raising device according to claim 7, further comprising means for advancing said film in a third direction relative to said tip portion of said elongate member and past said tip portion, and said second transporting means rotates said supporting means about an axis perpendicular to said first direction and parallel to said third direction.

9. A film raising device according to claim 1, wherein said supporting means comprises a rotary shaft, and said first transporting means comprises two guide members (3F) having guide slots (3f) extending in said first direction for guiding opposite ends of said rotary shaft for movement in said first direction, two arm members (3G) for rotatably supporting said opposite ends of said rotary shaft, and means for reciprocating said arm members within said guide slots so as to move said rotary shaft in said first direction.

10. A film raising device for raising an end portion of a film laminated on part of a main surface of a panel, for use in a film peeling apparatus, said film raising device comprising:

film press means for pressing against an unlaminated part of the main surface of the panel, said film press means comprising an elongate member extending in a first direction, and having a tip portion at one end for contacting an unlaminated part of the panel adjacent the end portion of the film;

holding means for holding said film press means for slidable movement in a second direction toward the panel, said holding means including a hollow cylindrical member, said film press means being disposed in said cylindrical member along an axis thereof, wherein said second direction is substantially the same as said first direction;

first spring means for urging said film press means in said second direction, said first spring means being mounted in said cylindrical member at an end of said elongate member opposite to the one end;

supporting means for supporting said cylindrical member for slidable movement in said second direction;

means for moving said supporting means along an arcuate path; and second spring means for urging said holding means in said second direction relative to said supporting means, said second spring means being mounted on said supporting means, wherein said first spring means is adapted to keep said tip portion of said film press means biased into contact with said unlaminated part of said main surface of said panel during movement of said supporting means such that said tip portion of said elongate member contacts the end portion of said film to thereby raise the end portion.

11. A method for peeling a film laminated on part of a main surface of a panel, comprising the steps of:
   transporting a supporting member for supporting a film press member toward the panel so that the film press member will contact an unlaminated part of the main surface of the panel;
   raising an end portion of the film proximate to the end portion of the panel by rotating the supporting member while urging the film press member toward the film so that the film press member presses against and raises the end portion of the film; and
   injecting fluid at the raised end portion of the film to peel the film from the panel.

12. A film peeling device for peeling a film laminated on a panel, said device comprising:
   a film raising device for raising an end portion of a film, said film raising device comprising film press means for pressing an end of the film at said end portion thereof, said film press means comprising an elongate member extending in a first direction, and having a tip portion at one end for contacting the end of the film, holding means for holding said film press means for slidable movement in a second direction toward the panel, said holding means including a hollow cylindrical member, said film press means being disposed in said cylindrical member along an axis thereof, first spring means for urging said film press means in said second direction, said first spring means being mounted in said cylindrical member at an end of said elongate member opposite to the one end, said second direction being substantially the same as said first direction, supporting means for supporting said cylindrical member for slidable movement in said second direction, second spring means for urging said holding means in said second direction relative to said supporting means, said second spring means being mounted on said supporting means, means for transporting said supporting means to a first position where said film press means contacts an end portion of a surface of the panel proximate to the end of the film, and means for rotating said supporting means to a second position where said film press means presses against the end of the film and raises the end portion thereof; and
   fluid injection means for injecting fluid at the end portion of the film raised by said film raising device.

13. A film raising device for raising an end portion of upper and lower films laminated on part of upper and lower main surfaces of a panel, for use in a film peeling apparatus, said end portion being located at one end of said films, said film raising device comprising upper and lower film pressing members located above and below said films, respectively, each of said film pressing members comprising:
   film press means for pressing against an unlaminated part of the main surface of the panel adjacent the one end of the film when said film press means is in a first position and for pressing against the one end of the film when said film press means is in a second position, said film press means comprising an elongate member extending in a first direction, and having a tip portion at one end for contacting the film when said film press means is in said second position;
   holding means for holding said film press means for slidable movement in a second direction toward the panel, said holding means including a hollow cylindrical member, said film press means being disposed in said cylindrical member along an axis thereof, wherein said second direction is substantially the same as said first direction;
   first spring means for urging said film press means in said second direction, said first spring means being mounted in said cylindrical member at an end of said elongate member opposite to the one end of said elongate member;
   supporting means for supporting said cylindrical member for slidable movement in said second direction, said cylindrical member being rotatable with said supporting means; and
   second spring means for urging said holding means in said second direction relative to said supporting means, said second spring means being mounted on said supporting means,
   wherein said film raising device further comprises:
   first transporting means for moving said supporting means to one position at which said film press means is in said first position; and
   second transporting means for rotating said supporting means to another position at which said film press means is in said second position.

14. A film raising device according to claim 13, wherein each said supporting means comprises a rotary shaft, and said first transporting means comprises two guide members (3F) each having a pair of upper and a pair of lower guide slots (3f) extending in said first direction for receiving and guiding opposite ends of each said rotary shaft, respectively, for movement in said first direction, upper and lower pairs of arm members (3G) for rotatably supporting said opposite ends of each said rotary shaft, and means for reciprocating both said upper and lower pairs of arm members within said guide slots so as to move each said rotary shaft in said first direction.

15. A film raising device according to claim 14, wherein said means for reciprocating comprises two linking arms (3H) each connected at opposite ends to one of said upper arms and a corresponding one of said lower arms, each of said linking arms being rotatable about a central shaft (3h), and drive means for reciprocatably rotating said linking arms about said central shaft to simultaneously move said upper and lower film press members in said first direction to move said film press means to said first position.

16. A film raising device according to claim 15, wherein said second transporting means comprises two mechanisms, each of said mechanisms comprising upper and lower rotatable arm members (3K), each of said upper and lower rotatable arm members having an end portion fixedly connected to a corresponding one of each said rotary shaft, and a guide slot (3k) formed at an opposite end portion and extending a predetermined distance in said first direction for slidably receiving said central rotary shaft, and drive means connected to said central rotary shaft for moving said central rotary shaft in a direction transverse to said first direction to rotate said rotatable arm members to thereby rotate each said rotary shaft.

17. A film raising device according to claim 16, wherein said predetermined distance is at least as great as a range of reciprocal motion of each said rotary shaft in said first direction.

* * * * *